United States Patent
Lee et al.

(10) Patent No.: US 11,600,593 B2
(45) Date of Patent: Mar. 7, 2023

(54) DIE BONDING APPARATUS AND METHOD AND SUBSTRATE BONDING APPARATUS AND METHOD

(71) Applicant: SEMES CO., LTD., Chungcheongnam-do (KR)

(72) Inventors: Hanglim Lee, Cheonan-si (KR); Jungsuk Goh, Suwon-si (KR); Kwangsup Kim, Asan-si (KR); Doyeon Kim, Yongin-si (KR); Minyoung Kim, Hwaseong-si (KR); Jihoon Park, Seoul (KR); Yungi Kim, Yongin-si (KR); Do Heon Kim, Cheonan-si (KR); Choonghyun Lee, Hwaseong-si (KR); Hyo Seok Lee, Gunpo-si (KR); Soo Ill Jang, Asan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 480 days.

(21) Appl. No.: 16/658,469

(22) Filed: Oct. 21, 2019

(65) Prior Publication Data

US 2020/0126948 A1    Apr. 23, 2020

(30) Foreign Application Priority Data

Oct. 19, 2018    (KR) .................. 10-2018-0125032

(51) Int. Cl.
*H01L 23/00*    (2006.01)
*H01L 21/67*    (2006.01)

(52) U.S. Cl.
CPC ........ *H01L 24/741* (2013.01); *H01L 21/6715* (2013.01)

(58) Field of Classification Search
CPC .................... H01L 21/6715; H01L 24/74–799
See application file for complete search history.

(56) References Cited

U.S. PATENT DOCUMENTS

| 54,421,953 | 8/1995 | Nagakubo et al. |
| 2006/0266792 A1* | 11/2006 | Ko ........................ B23K 37/047 257/E21.705 |

(Continued)

FOREIGN PATENT DOCUMENTS

| CN | 17557101 A | 4/2006 |
| CN | 104603923 A | 5/2014 |

(Continued)

OTHER PUBLICATIONS

Korean Patent Office, Office action dated Apr. 14, 2020.

*Primary Examiner* — Dah-Wei D. Yuan
*Assistant Examiner* — Stephen A Kitt
(74) *Attorney, Agent, or Firm* — Li & Cai Intellectual Property (USA) Office

(57) ABSTRACT

Disclosed are a die bonding apparatus, a substrate bonding apparatus, a die bonding method, and a substrate bonding method that are capable of bonding a die to a substrate or bonding substrates together without using a bonding medium such as an adhesion film and a solder bump. The die bonding method includes hydrophilizing a bonding surface of the die, by plasma processing, forming a liquid film on a bonding area of the substrate, by supplying a liquid including water to the bonding area of the substrate, pre-bonding the die to the substrate by bringing the die into contact with the liquid film, and post-bonding one or more dies to the substrate at the same time, by performing heat treatment in a state in which the one or more dies are pre-bonded to the substrate.

16 Claims, 17 Drawing Sheets

(56) References Cited

U.S. PATENT DOCUMENTS

| | | | |
|---|---|---|---|
| 2009/0145546 A1* | 6/2009 | Inamoto | H01L 24/75 156/272.6 |
| 2013/0140713 A1* | 6/2013 | Yu | H01L 24/97 257/782 |
| 2013/0256911 A1 | 10/2013 | Lee et al. | |
| 2015/0096651 A1* | 4/2015 | Kojio | H01L 24/81 148/23 |
| 2015/0129135 A1 | 5/2015 | Lee et al. | |
| 2015/0189204 A1 | 7/2015 | Oganesian et al. | |
| 2017/0200711 A1* | 7/2017 | Uzoh | H01L 22/14 |

FOREIGN PATENT DOCUMENTS

| | | |
|---|---|---|
| CN | 104160487 A | 11/2014 |
| FR | 29876226 A1 | 9/2013 |
| JP | 6-302486 A | 10/1994 |
| JP | 2006-294571 A | 10/2006 |
| JP | 2006-339363 A | 12/2006 |
| JP | 2013-182972 A | 9/2013 |
| KR | 10-2014-0133539 A | 11/2014 |
| KR | 10-2016-0018411 A | 2/2016 |
| WO | WO 2007043152 A1 | 4/2007 |

\* cited by examiner

DIE BONDING APPARATUS AND METHOD AND SUBSTRATE BONDING APPARATUS AND METHOD

CROSS-REFERENCE TO RELATED APPLICATIONS

A claim for priority under 35 U.S.C. § 119 is made to Korean Patent Application No. 10-2018-0125032 filed on Oct. 19, 2018, in the Korean Intellectual Property Office, the entire contents of which are hereby incorporated by reference.

BACKGROUND

Embodiments of the inventive concept described herein relate to a die bonding apparatus, a substrate bonding apparatus, a die bonding method, and a substrate bonding method, and more particularly, relate to a die bonding apparatus and method and a substrate bonding apparatus and method that are capable of bonding a die to a substrate or bonding substrates together without using a bonding medium including an adhesion film and a solder bump.

Recently, 3D package technologies for stacking semiconductor elements in three dimensions have attracted a lot of attention because there has been a limit to improve the degree of integration of semiconductor elements. Representatively, the technology for commercializing a 3D integrated circuit by using a Through Silicon Via (TSV) has been studied. 3D semiconductors may be manufactured through a die bonding process of stacking and bonding TSV dies.

FIGS. 1 to 3 are views illustrating a die bonding process in the related art. Referring to FIG. 1, an adhesion film 3b and solder bumps 3c, which are bonding mediums, are provided on a lower bonding surface of a TSV chip 3a to bond a TSV die 3 to a master wafer 1. The TSV die 3 including the adhesion film 3b and the solder bumps 3c is transferred above the master wafer 1 and aligned in a bonding position by a bonding head 10. Thereafter, the TSV die 3 is placed on the upper surface of the master wafer 1 or the upper surface of a TSV die 2 bonded to the master wafer 1.

A bonding process for the TSV die 3 includes a pre-bonding process and a post-bonding process. Referring to FIG. 2, the TSV die 3 is firstly bonded to the master wafer 1 by the pre-bonding process of pressing the TSV die 3 against the master wafer 1 and heating the TSV die 3 by the bonding head 10. For the pre-bonding of the TSV die 3, the bonding head 10 includes a means for pressing the TSV die 3 against the master wafer 1 and heating the TSV die 3. After the TSV die 3 is pre-bonded to the master wafer 1, the post-bonding process of curing the adhesion film 3b and the solder bumps 3c by performing heat treatment on the TSV die 3 at a high temperature and pressing the TSV die 3 is performed, and the TSV die 3 is completely bonded to the master wafer 1 by thermal compression, with the bonding film 3b and the solder bumps 3c serving as mediums.

Referring to FIG. 3, the TSV dies 2, 3, and 4 are bonded one by one to the master wafer 1 by being sequentially subjected to stacking, pre-bonding, and post-bonding one by one. In the die bonding method in the related art, every time the dies are bonded one by one, the dies have to be pressed and heated by using the bonding head 10, and the post-bonding process of thermally fusing the dies by high-temperature heat treatment has to be performed. Therefore, the time taken to perform the post-bonding process is increased in proportion to the number of dies that are bonded to the master wafer 1.

Furthermore, due to the scaling-down of an I/O pitch that is the gap between TSVs, the solder bumps may be swept and connected with the surrounding solder bumps to cause a short circuit when high-temperature/high-load bonding is performed to completely bond the stacked TSV dies. Therefore, it is difficult to use the bonding mediums. To solve the problem, the solder bumps have to be made smaller in size. However, this cannot be a complete countermeasure due to physical limitations. Moreover, the die bonding method in the related art has a problem in that as the master wafer and the TSV chip are made thinner, damage such as a crack is caused in the TSV chip and the master wafer in the high-temperature/high-load post-bonding process.

SUMMARY

Embodiments of the inventive concept provide a die bonding apparatus, a substrate bonding apparatus, a die bonding method, and a substrate bonding method that are capable of bonding a die to a substrate or bonding substrates together without using bonding mediums such as an adhesion film and a solder bump.

Embodiments of the inventive concept provide a die bonding apparatus, a substrate bonding apparatus, a die bonding method, and a substrate bonding method that are capable of effectively bonding a die to a substrate or effectively bonding substrates together and that are capable of reducing process time taken to pre-bond and post-bond a die or a substrate.

According to an exemplary embodiment, a die bonding method for bonding a die to a substrate includes hydrophilizing a bonding surface of the die that is to be bonded to the substrate, by plasma processing, forming a liquid film on a bonding area of the substrate that is to be bonded with the die, by supplying a liquid including water to the bonding area of the substrate, pre-bonding the die to the substrate by a bonding force between the hydrophilized bonding surface of the die and the liquid film, by bringing the die into contact with the liquid film, and post-bonding one or more dies to the substrate at the same time, by performing heat treatment in a state in which the one or more dies are pre-bonded to the substrate.

In hydrophilizing the bonding surface, the bonding surface of the die may be hydrophilized by an atmospheric plasma device.

The die bonding method may further include picking up, by a bonding head, the die supported on a support unit and transferring the die above the substrate supported on a bonding stage.

In hydrophilizing the bonding surface, the bonding surface of the die may be hydrophilized by the atmospheric plasma device provided between the support unit and the bonding stage while the die is transferred from the support unit to the bonding stage by the bonding head.

In hydrophilizing the bonding surface, the bonding surface of the die may be hydrophilized while the die is moved within a plasma processing interval of the atmospheric plasma device.

The hydrophilizing of the bonding surface may include forming a plasma zone containing hydrophilic radicals on the top of the atmospheric plasma device and transferring the die to cause the bonding surface of the die to pass through the plasma zone in a plasma processing interval of the atmospheric plasma device.

The hydrophilizing of the bonding surface may include detecting whether the die is located within the plasma processing interval, stopping operation of the atmospheric plasma device when the die is not located within the plasma processing interval, and operating the atmospheric plasma device to generate plasma when the die is located within the plasma processing interval.

The die bonding method may further include cleaning the bonding surface of the die by a cleaning unit provided between the support unit and the atmospheric plasma device.

The liquid may include deionized water.

In forming the liquid film, the liquid film may be locally formed on the bonding area of the substrate that is to be bonded with the die.

In forming the liquid film, the liquid film may be formed by a jetting-type patterning device having a piezoelectric element applied thereto.

A plurality of dies having a Through Silicon Via (TSV) may be stacked on and pre-bonded to the substrate after hydrophilized. The plurality of dies may be pre-bonded to the substrate without using thermal compression bonding through a bonding medium including an adhesion film and a solder bump.

According to an exemplary embodiment, a substrate bonding method for bonding a second substrate to a first substrate includes picking up, by a bonding head, the second substrate supported on a support unit and transferring the second substrate above the first substrate supported on a bonding stage, hydrophilizing a lower surface of the second substrate by an atmospheric plasma device provided between the support unit and the bonding stage while the second substrate is transferred from the support unit to the bonding stage by the bonding head, forming a liquid film on the first substrate by supplying a liquid including water to an upper surface of the first substrate, pre-bonding the second substrate to the first substrate by a bonding force between the hydrophilized lower surface of the second substrate and the liquid film, by bringing the lower surface of the second substrate into contact with the liquid film, and post-bonding the second substrate to the first substrate by performing heat treatment in a state in which the second substrate is pre-bonded to the first substrate.

The hydrophilizing of the lower surface of the second substrate may include forming a plasma zone containing hydrophilic radicals on the top of the atmospheric plasma device, passing the lower surface of the second substrate through the plasma zone in a plasma processing interval of the atmospheric plasma device, detecting whether the second substrate is located within the plasma processing interval, stopping operation of the atmospheric plasma device when the second substrate is not located within the plasma processing interval, and operating the atmospheric plasma device to generate plasma when the second substrate is located within the plasma processing interval.

According to an exemplary embodiment, a die bonding apparatus for bonding a die to a substrate includes a support unit that supports the die, a bonding stage that supports the substrate, a bonding head that is provided between the support unit and the bonding stage so as to be movable and that picks up the die and transfers the die to a bonding area on the substrate, a plasma device that hydrophilizes a bonding surface of the die that is to be bonded to the substrate, by plasma processing, and a wetting device that forms a liquid film on the bonding area of the substrate that is to be bonded with the die, by supplying a liquid including water to the bonding area of the substrate.

The bonding head may pre-bond the die to the substrate by a bonding force between the hydrophilized bonding surface of the die and the liquid film, by bringing the bonding surface of the die into contact with the liquid film.

The die bonding apparatus may further include a heat treatment unit that post-bonds one or more dies to the substrate at the same time, by performing heat treatment in a state in which the one or more dies are pre-bonded to the substrate.

The plasma device may include an atmospheric plasma device provided between the support unit and the bonding stage.

The die bonding method may further include a cleaning unit that is provided between the support unit and the atmospheric plasma device and that cleans the bonding surface of the die picked up by the bonding head.

The atmospheric plasma device may form a plasma zone containing hydrophilic radicals on the top of the atmospheric plasma device, and the plasma zone may overlap a transfer path of the die.

The die bonding apparatus may further include a detector that detects whether the die is located within a plasma processing interval of the atmospheric plasma device and a controller that stops operation of the atmospheric plasma device when the die is not located within the plasma processing interval and that operates the atmospheric plasma device to generate plasma when the die is located within the plasma processing interval.

The die bonding apparatus may further include a transfer device that moves the atmospheric plasma device along a transfer direction of the die.

The transfer device may move the atmospheric plasma device at a speed equal to or lower than a transfer speed of the die while the die is moved in the plasma processing interval.

The wetting device may locally form the liquid film on the bonding area of the substrate that is to be bonded with the die.

The die bonding apparatus may further include a transfer rail arranged along a transfer direction of the die, and the wetting device may be transferred between an area above the bonding stage and a retreat area distant from the bonding stage along the transfer rail.

According to an exemplary embodiment, a substrate bonding apparatus for bonding a second substrate to a first substrate includes a support unit that supports the second substrate, a bonding stage that supports the first substrate, a bonding head that is provided between the support unit and the bonding stage so as to be movable and that picks up the second substrate and transfers the second substrate above the first substrate, an atmospheric plasma device that hydrophilizes a lower surface of the second substrate by plasma processing, and a wetting device that forms a liquid film by supplying a liquid including water to an upper surface of the first substrate.

The bonding head may pre-bond the second substrate to the first substrate by a bonding force between the hydrophilized lower surface of the second substrate and the liquid film, by bringing the lower surface of the second substrate into contact with the liquid film.

The substrate bonding apparatus may further include a heat treatment unit that post-bonds the second substrate to the first substrate by performing heat treatment in a state in which the second substrate is pre-bonded to the first substrate.

The atmospheric plasma device may form a plasma zone containing hydrophilic radicals on the top of the atmospheric plasma device, and the plasma zone may overlap a transfer path of the second substrate.

The substrate bonding apparatus may further include a detector that detects whether the second substrate is located within a plasma processing interval of the atmospheric plasma device and a controller that stops operation of the atmospheric plasma device when the second substrate is not located within the plasma processing interval and that operates the atmospheric plasma device to generate plasma when the second substrate is located within the plasma processing interval.

The substrate bonding apparatus may further include a transfer rail arranged along a transfer direction of the second substrate, and the wetting device may be transferred between an area above the bonding stage and a retreat area distant from the bonding stage along the transfer rail.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
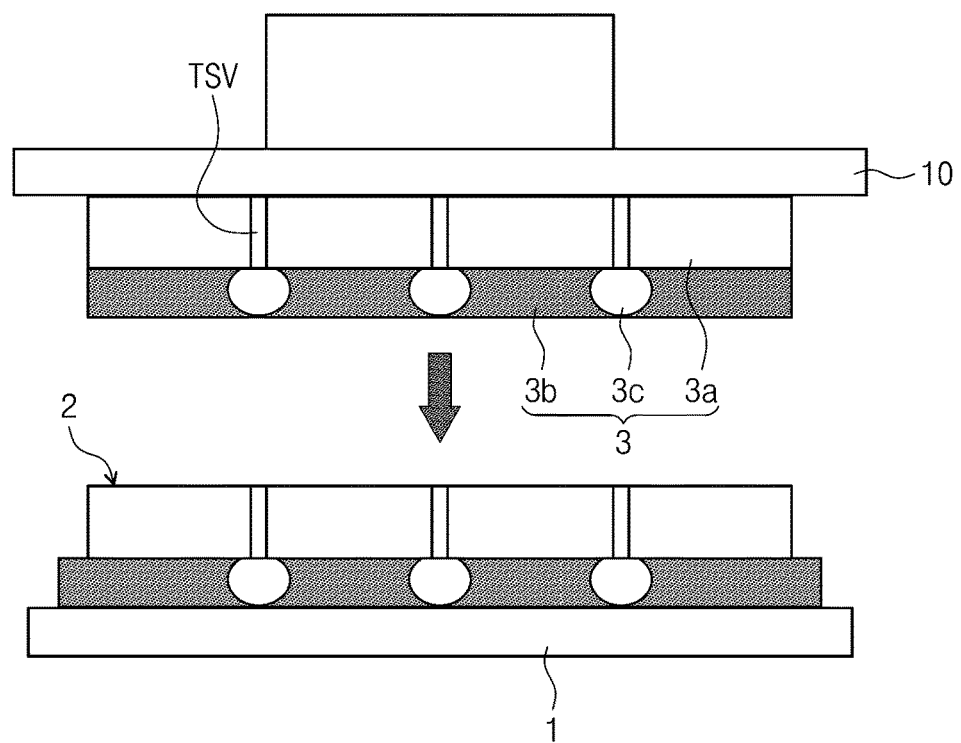
FIGS. 1 to 3 are views illustrating a die bonding process in the related art.
Figure 2:
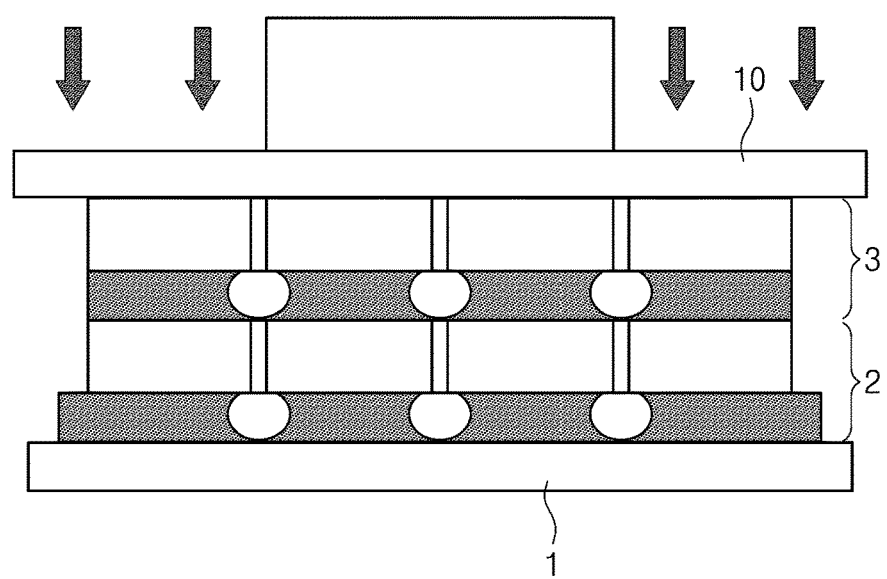
Figure 3:
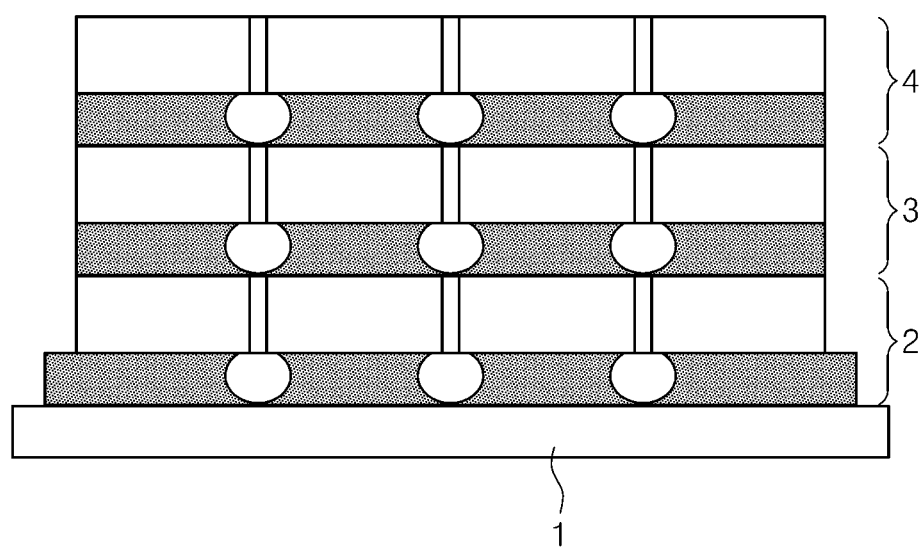

Hereinafter, embodiments of the inventive concept will be described in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. In the drawings, the dimensions of components are exaggerated for clarity of illustration.

A die bonding method according to an embodiment of the inventive concept includes hydrophilizing a lower surface (a bonding surface) of a die by atmospheric plasma processing of a flying type while the die is transferred to a bonding stage by a bonding head and forming a liquid film by supplying a liquid (e.g., DI water) including water to a bonding area on a substrate supported on the bonding stage. When the hydrophilized bonding surface of the die is brought into contact with the liquid film on the substrate by the bonding head, the die is pre-bonded to the substrate by the bonding force between the bonding surface of the die and the liquid film. After one or more dies are pre-bonded to the substrate, the dies are post-bonded to the substrate by high-temperature/high-pressure heat treatment.

According to the embodiment of the inventive concept, a substrate and a die (e.g., a TSV die), or substrates, may be bonded together without using bonding mediums such as an adhesion film and a solder bump. Accordingly, in manufacturing semiconductors with a fine I/O pitch, defects such as a sweep of a solder bump, a short circuit, and the like may be prevented. Furthermore, a post-bonding process may be performed on a substrate-by-substrate basis rather than on a die-by-die basis. Thus, the time taken to perform the bonding process may be reduced.

Moreover, according to the embodiment of the inventive concept, the lower surface (the bonding surface) of the die may be hydrophilized by the atmospheric plasma processing of the flying type while the die is transferred to the bonding stage, which makes it possible to reduce the time taken to perform the hydrophilization (the atmospheric plasma processing) for the pre-bonding of the die. In addition, the wetting process of forming the liquid film on the substrate may be performed during the transfer of the die, and thus semiconductor productivity may be improved.

In this disclosure, bonding a die to a substrate includes not only directly bonding the die to the upper surface of the substrate but also bonding the die to the upper surface of a die pre-bonded to the substrate or bonding the die to the upper surface of the uppermost die among the dies that are stacked in multiple layers on the substrate and pre-bonded to the substrate. Furthermore, forming a liquid film by spraying a liquid such as DI water to a substrate includes directly forming the liquid film on the upper surface of the substrate or forming the liquid film on the upper surface of one or more dies stacked on the substrate.

Figure 4:
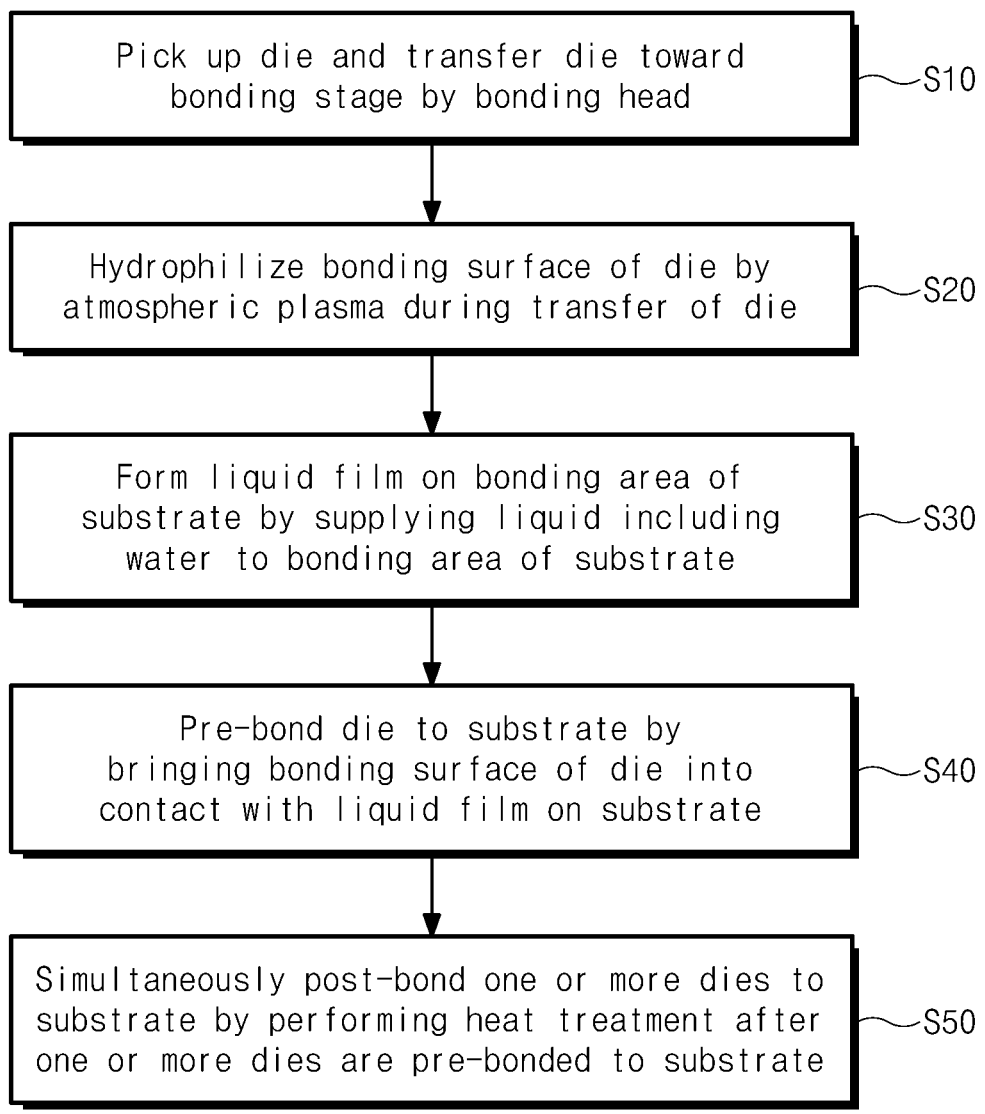
FIG. 4 is a flowchart illustrating a die bonding method according to an embodiment of the inventive concept.

FIG. 4 is a flowchart illustrating a die bonding method according to an embodiment of the inventive concept. Referring to FIG. 4, a dicing process of dicing a semiconductor wafer into dies is performed, and a bonding head picks up a die and transfers the die toward a bonding stage on which a substrate (a master wafer) is supported (S10).

While the die is transferred toward the bonding stage by the bonding head, a bonding surface (a lower surface) of the die is hydrophilized by atmospheric plasma (S20). While the die is transferred toward the bonding stage, the bonding surface of the die is hydrophilized by hydrophilic radicals formed by an atmospheric plasma device. The atmospheric plasma device may be implemented with, for example, an atmospheric oxygen/argon plasma device, an atmospheric water-vapor plasma device, or the like. For atmospheric plasma processing of a flying type, the atmospheric plasma device may form a plasma zone on the transfer path of the die. The hydrophilic radicals may include hydrogen or hydroxyl radicals.

While the die is transferred to the bonding stage, a wetting device moves above the bonding stage and supplies a liquid including water to a die-bonding area on the substrate, which is supported on the bonding stage, to form a liquid film on the bonding area of the substrate (S30). The liquid supplied to the bonding area on the substrate may be, for example, deionized water (DIW). After the liquid film is formed on the bonding area of the substrate, the wetting device retreats from the area above the bonding stage to a standby location to allow the bonding head to place the die on the bonding area of the substrate.

After the liquid film is formed on the bonding area of the substrate, the bonding head moves above the bonding stage and lowers the die such that the bonding surface of the die is brought into contact with the liquid film on the substrate. When the bonding surface of the die is brought into contact with the liquid film, the die is pre-bonded to the substrate by the bonding force (the hydrogen bonding force) between the hydrophilized bonding surface of the die and the liquid film even though the die is not pressed or heated (S40).

The bonding head returns to the area above the diced semiconductor wafer, picks up a new die to be bonded, and repeats the above-described process. After the dies are pre-bonded to the substrate, the substrate having the dies pre-bonded thereto is transferred into a heat treatment chamber and subjected to high-temperature heat treatment (annealing) to simultaneously post-bond the dies on a substrate-by-substrate basis (S50).

Figure 5:
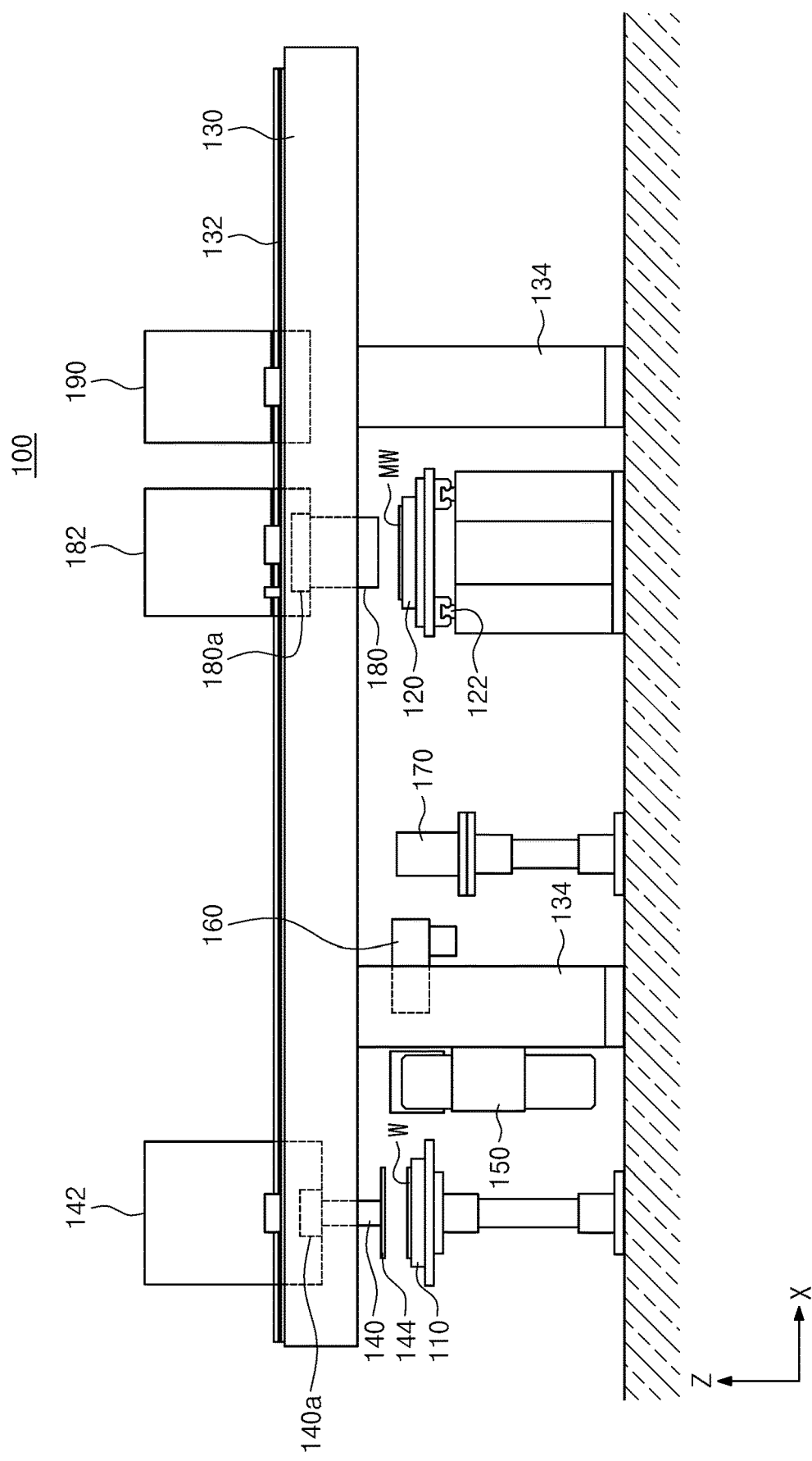
FIG. 5 is a schematic side view illustrating a die bonding apparatus according to an embodiment of the inventive concept.
Figure 6:
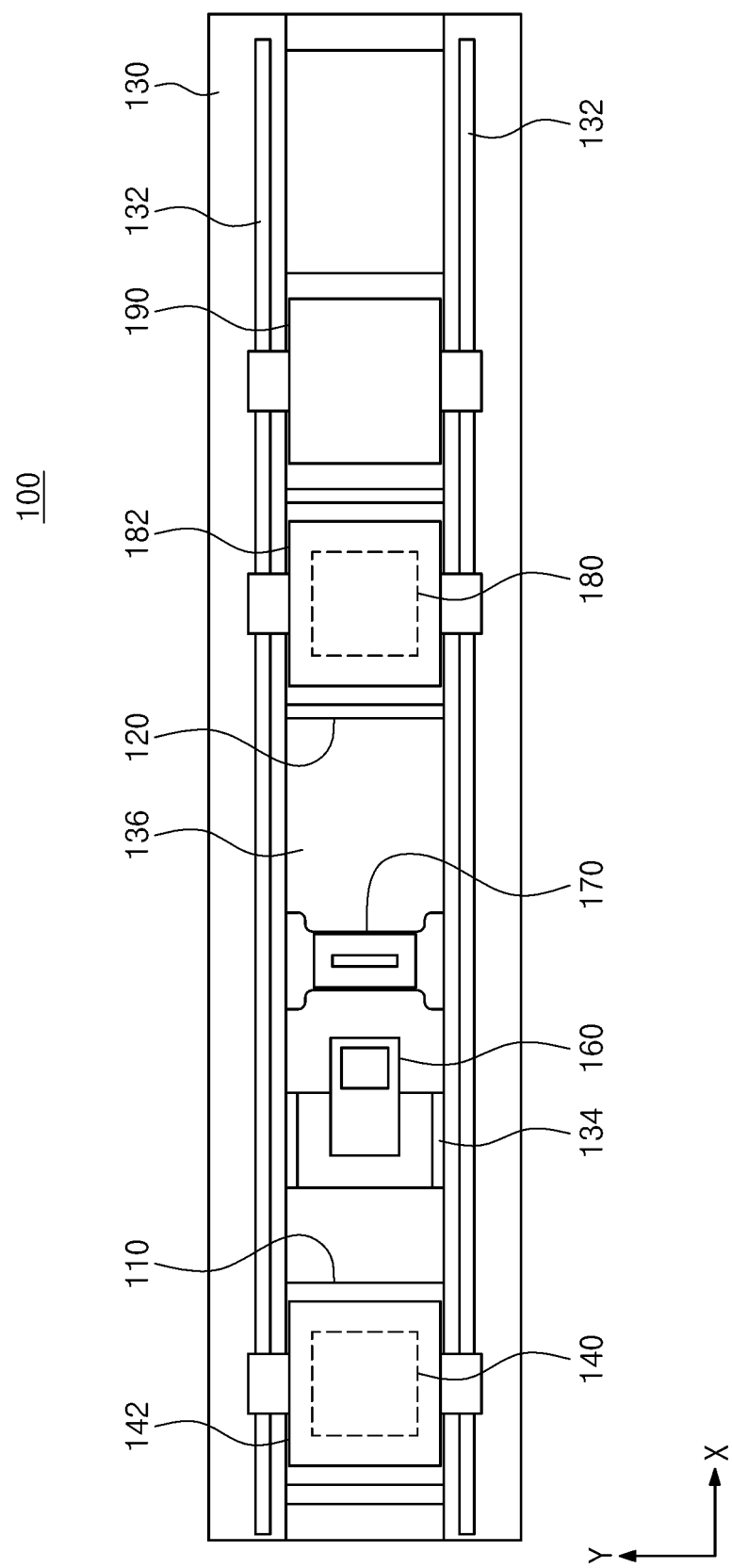
FIG. 6 is a schematic plan view illustrating the die bonding apparatus according to the embodiment of the inventive concept.

FIG. 5 is a schematic side view illustrating a die bonding apparatus according to an embodiment of the inventive concept. FIG. 6 is a schematic plan view illustrating the die bonding apparatus according to the embodiment of the inventive concept. Referring to FIGS. 5 and 6, the die bonding apparatus 100 according to the embodiment of the inventive concept includes a support unit 110, a bonding stage 120, a bonding head 140, an atmospheric plasma device 170, a wetting device 180, and a heat treatment unit (not illustrated).

The support unit 110 supports a semiconductor wafer W diced into dies. The bonding stage 120 supports a substrate MW. The support unit 110 and the bonding stage 120 may include chucks for supporting the semiconductor wafer W and the substrate MW, respectively. The bonding head 140 is configured to pick up a die supported on the support unit 110 and to transfer the die to a bonding area on the substrate MW.

The bonding head 140 may reciprocate between the area above the support unit 110 and the area above the bonding stage 120 along a pair of transfer rails 132. The transfer rails 132 may be provided on a frame 130 supported by supports 134. Hereinafter, the direction toward the bonding stage 120 from the support unit 110 is referred to as the first direction X, the direction perpendicular to the first direction X on the plane on which the semiconductor wafer W and the substrate MW are supported is referred to as the second direction Y, and the vertical direction perpendicular to both the first direction X and the second direction Y is referred to as the third direction Z.

The transfer rails 132 are arranged along the first direction X. The bonding head 140 may be moved in the first direction X by a carriage 142 that is coupled to the transfer rails 132 so as to be movable. A passage 136 for the transfer of the bonding head 140 may be formed in the frame 130. The bonding head 140 may be stably moved along the first direction X in the state of being supported by the pair of transfer rails 132 provided on opposite sides of the passage 136 formed in the frame 130.

The bonding head 140 may be raised or lowered in the third direction Z by a lifting unit 140a mounted in the carriage 142. The bonding head 140 includes a ground plate 144 at a lower end thereof. The bonding head 140 may pick up a die from the semiconductor wafer W in a manner such as vacuum suction. When the bonding head 140 picks up the die, an examination unit 150 installed on the frame 130 examines the location of the die picked up by the bonding head 140. The examination unit 150 may examine the location of the die based on vision.

A cleaning unit 160 installed on the frame 130 cleans a lower surface (a bonding surface) of the die picked up by the bonding head 140. The cleaning unit 160 may be provided between the support unit 110 and the atmospheric plasma device 170. The cleaning unit 160 may be a cleaning device in which an air spray unit, a vacuum suction unit, and an ionizer are combined. To improve processing speed, the cleaning unit 160 performs a cleaning process while the die picked up by the bonding head 140 is moved.

Figure 7:
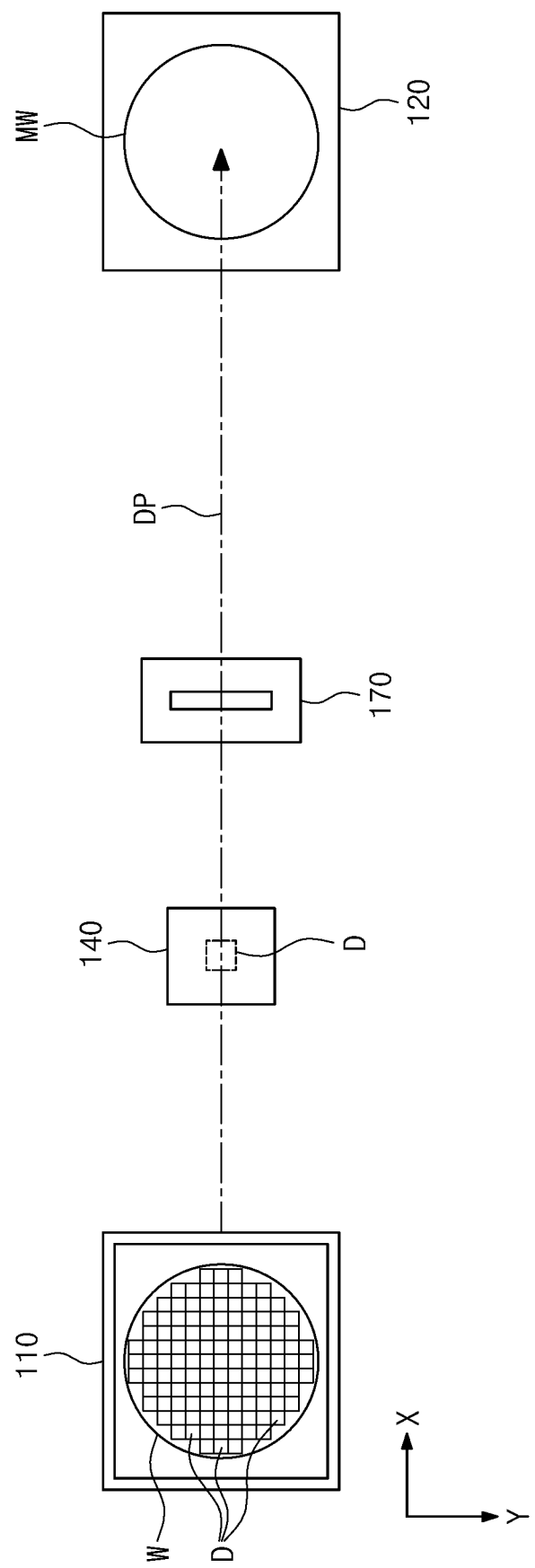
FIG. 7 is a schematic plan view illustrating an arrangement of a support unit, an atmospheric plasma device, and a bonding stage that constitute the die bonding apparatus according to the embodiment of the inventive concept.
Figure 8:
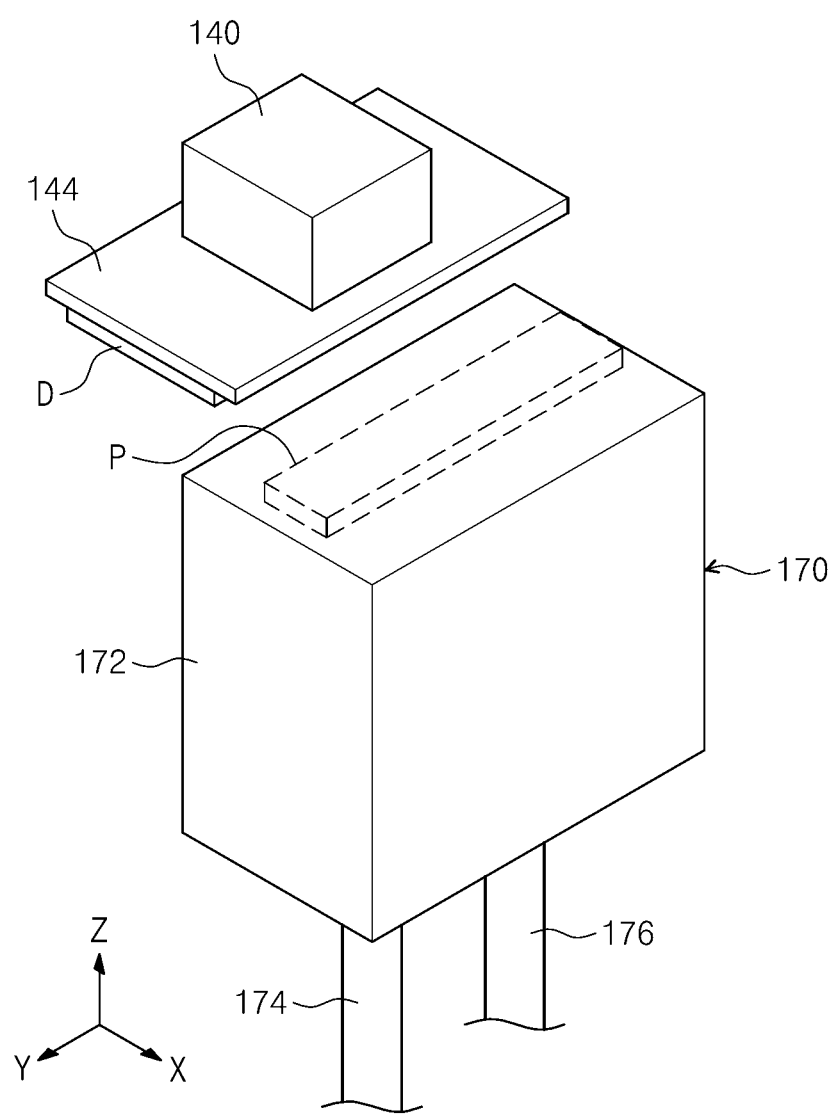
FIG. 8 is a schematic perspective view illustrating the atmospheric plasma device constituting the die bonding apparatus according to the embodiment of the inventive concept.
Figure 9:
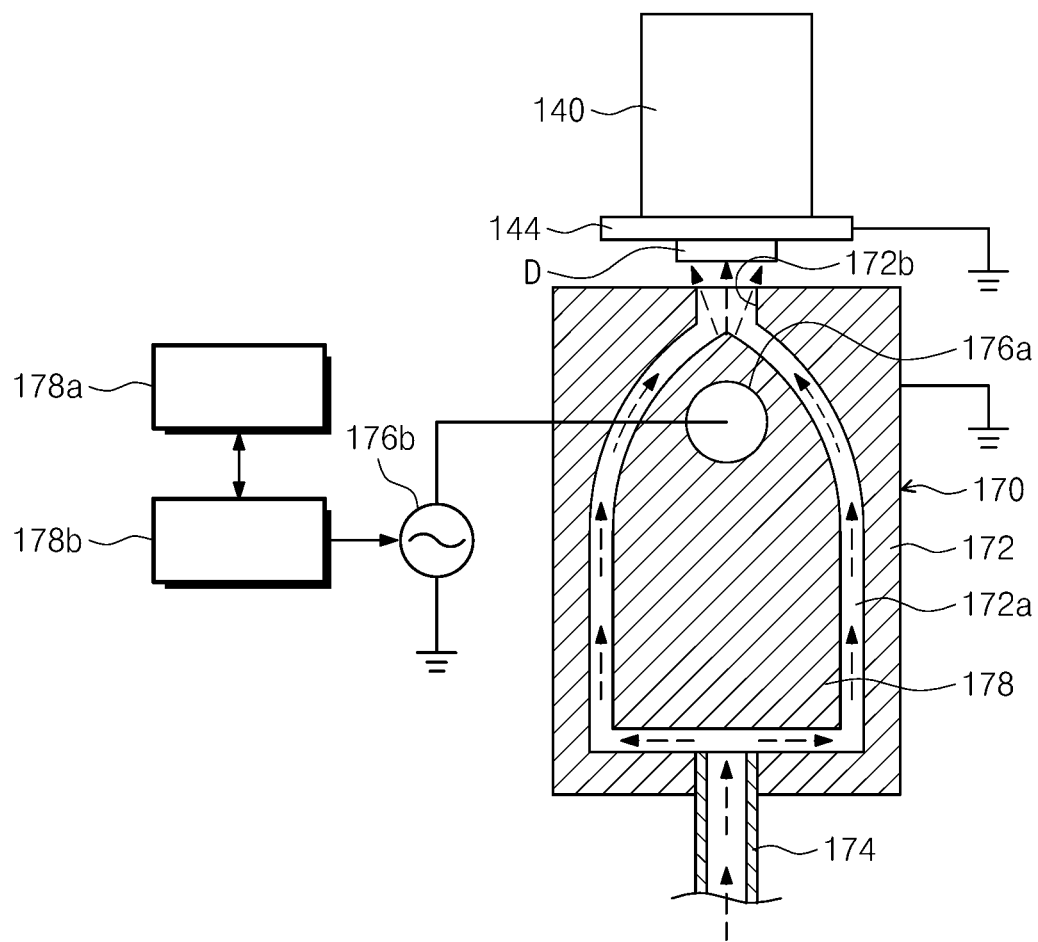
FIG. 9 is a schematic sectional view illustrating the atmospheric plasma device constituting the die bonding apparatus according to the embodiment of the inventive concept.

FIG. 7 is a schematic plan view illustrating an arrangement of the support unit, the atmospheric plasma device, and the bonding stage that constitute the die bonding apparatus according to the embodiment of the inventive concept. FIG. 8 is a schematic perspective view illustrating the atmospheric plasma device constituting the die bonding apparatus according to the embodiment of the inventive concept. FIG. 9 is a schematic sectional view illustrating the atmospheric plasma device constituting the die bonding apparatus according to the embodiment of the inventive concept.

Referring to FIGS. 7 to 9, the atmospheric plasma device 170 may be provided between the support unit 110 and the bonding stage 120 on a transfer path DP of a die D. The atmospheric plasma device 170 performs atmospheric plasma processing to hydrophilize a bonding surface of the die D being transferred by the bonding head 140. The atmospheric plasma device 170 forms a plasma zone P containing hydrophilic radicals on the top thereof. The plasma zone P may be formed to overlap the transfer path DP of the die D.

The atmospheric plasma device 170 may include a main body 172, a gas supply unit 174 for introducing a process gas into the main body 172, and an RF power application unit 176 for forming plasma by exciting the process gas. The main body 172 has a delivery passage 172a formed therein, through which the process gas supplied from the gas supply unit 174 is delivered upward. RF power supplied from an RF power supply 176b is applied, through the RF power application unit 176, to an electrode 176a insulated by an insulator 178.

An opening 172b for forming plasma gas excited by the RF power in the plasma zone P is formed at the top of the main body 172. The opening 172b may have a length equal to or greater than the width of the die D in the second direction Y to allow hydrophilization to be performed over the entire width of the die D in the second direction Y. An operational state of the atmospheric plasma device 170 may be controlled by a detector 178a and a controller 178b.

Figure 10:
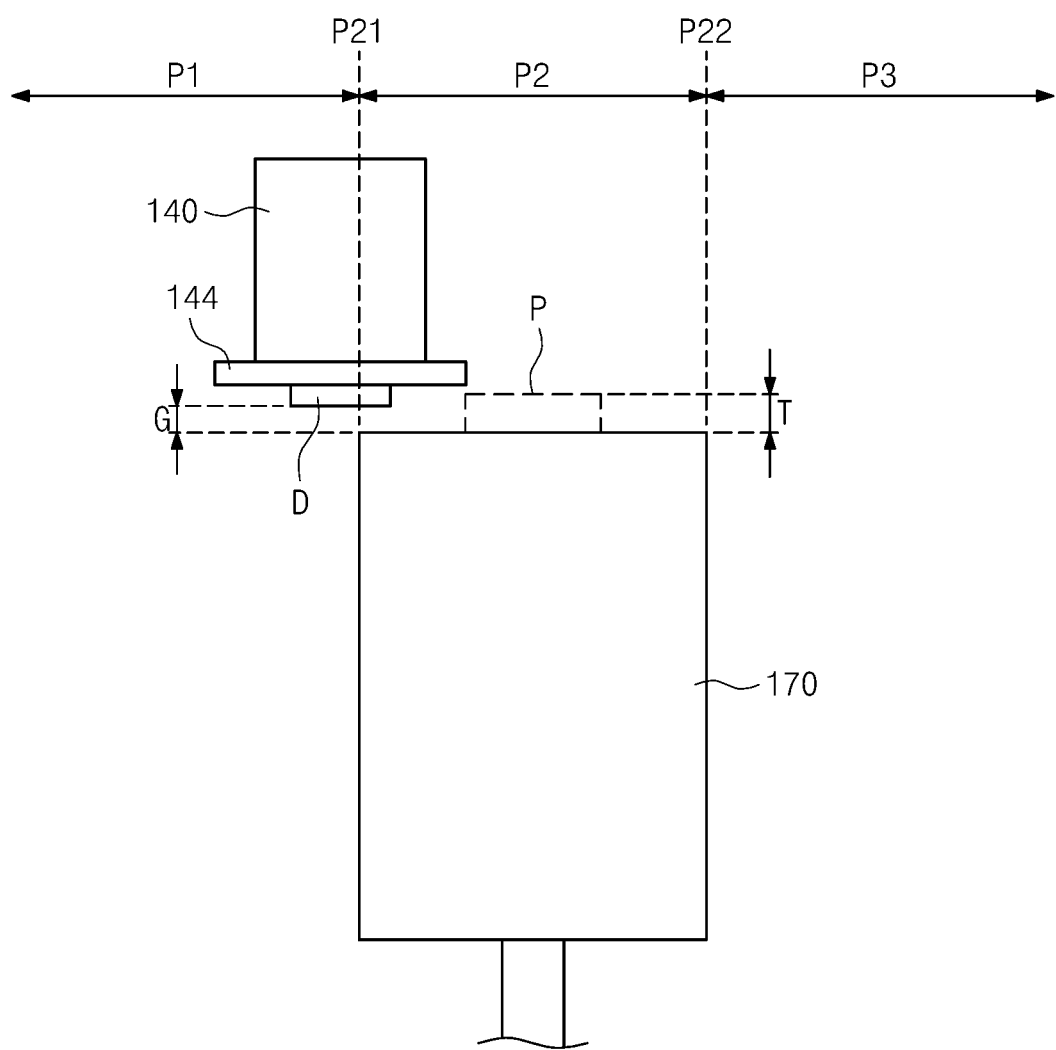
FIG. 10 is a view illustrating operation of the atmospheric plasma device constituting the die bonding apparatus according to the embodiment of the inventive concept.

FIG. 10 is a view illustrating operation of the atmospheric plasma device constituting the die bonding apparatus according to the embodiment of the inventive concept. Referring to FIGS. 7 to 10, the detector 178a detects whether the die D is located within a plasma processing interval P2 of the atmospheric plasma device 170. When the die D is located in an interval P1 before the plasma processing interval P2 or in an interval P3 after the plasma processing interval P2, the controller 178b may stop operation of the atmospheric plasma device 170, and when the die D is located within the plasma processing interval P2, the controller 178b may operate the RF power supply 176b of the atmospheric plasma device 170 and the gas supply unit 174 to generate plasma.

When the die D enters a plasma start location P21 of the plasma processing interval P2, operation of the atmospheric plasma device 170 may be started by the controller 178b, and the plasma zone P may be formed on the transfer path of the die D. When the die D passes through a plasma end location P22 of the plasma processing interval P2, the operation of the atmospheric plasma device 170 is stopped.

To allow the lower surface (the bonding surface) of the die D to pass through the plasma zone P, the transfer height of the die D and the location of the atmospheric plasma device 170 may be determined such that the vertical gap G between the die D and the atmospheric plasma device 170 is smaller than the thickness T of the plasma zone P exposed on the top of the atmospheric plasma device 170. The plasma zone P may be formed to a thickness of a few millimeters. In this case, the vertical gap G between the die D and the atmospheric plasma device 170 may be set to a few millimeters that are smaller than the thickness T of the plasma zone P.

The plasma start location P21 and the plasma end location P22 may be set such that arc discharge is not caused in the bonding head 140 by plasma and the bonding surface of the die D is hydrophilized all over. If the plasma processing interval P2 is set to be too wide, a risk that arc discharge occurs in the bonding head 140 may be increased, and the atmospheric plasma device 170 may operate for a longer period of time than necessary, resulting in an increase in process cost. Furthermore, if the plasma processing interval P2 is set to be too narrow, the front and rear corners of the bonding surface of the die D may not be partially hydrophilized, or the hydrophilic state may not be uniform.

In an embodiment, the plasma start location P21 may be set as the location where the front end of the ground plate 144 starts to enter the plasma zone P, and the plasma end location P22 may be set as the location where the rear end of the ground plate 144 starts to exit the plasma zone P. The transfer speed of the die D in the plasma processing interval P2 may be set to be equal to or lower than the transfer speed of the die D before and after the plasma processing interval P2.

In the case where the bonding surface of the die D is sufficiently hydrophilized even though the transfer speed of the die D is not reduced in the plasma processing interval P2, the die D may be transferred without a speed change within the plasma processing interval P2 to improve productivity. In the case where a sufficient hydrophilic effect on the bonding surface of the die D is not obtained if the transfer speed of the die D is not reduced in the plasma processing interval P2, the moving speed of the bonding head 140 may be reduced in the plasma processing interval P2. In the case of reducing the transfer speed of the die D, the moving speed of the bonding head 140 may be controlled in synchronization with the plasma processing interval P2, and the transfer speed of the bonding head 140 may start to be reduced in advance at a location a set distance ahead of the plasma processing interval P2.

Figure 11:
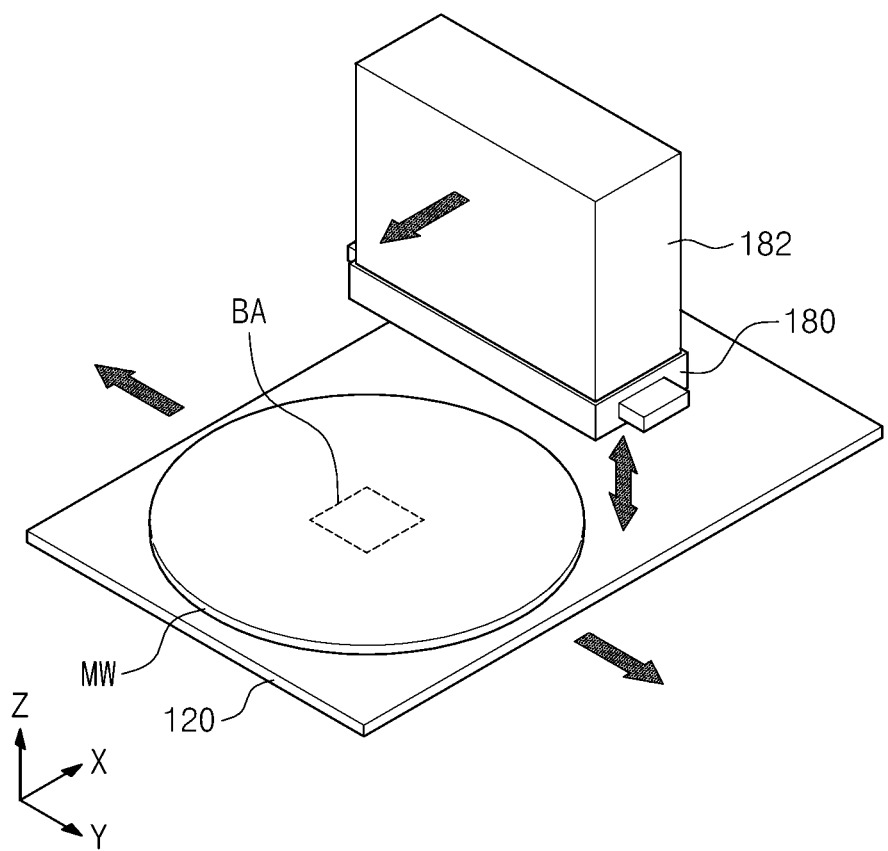
FIGS. 11 to 13 are views illustrating operation of a wetting device constituting the die bonding apparatus according to the embodiment of the inventive concept.
Figure 12:
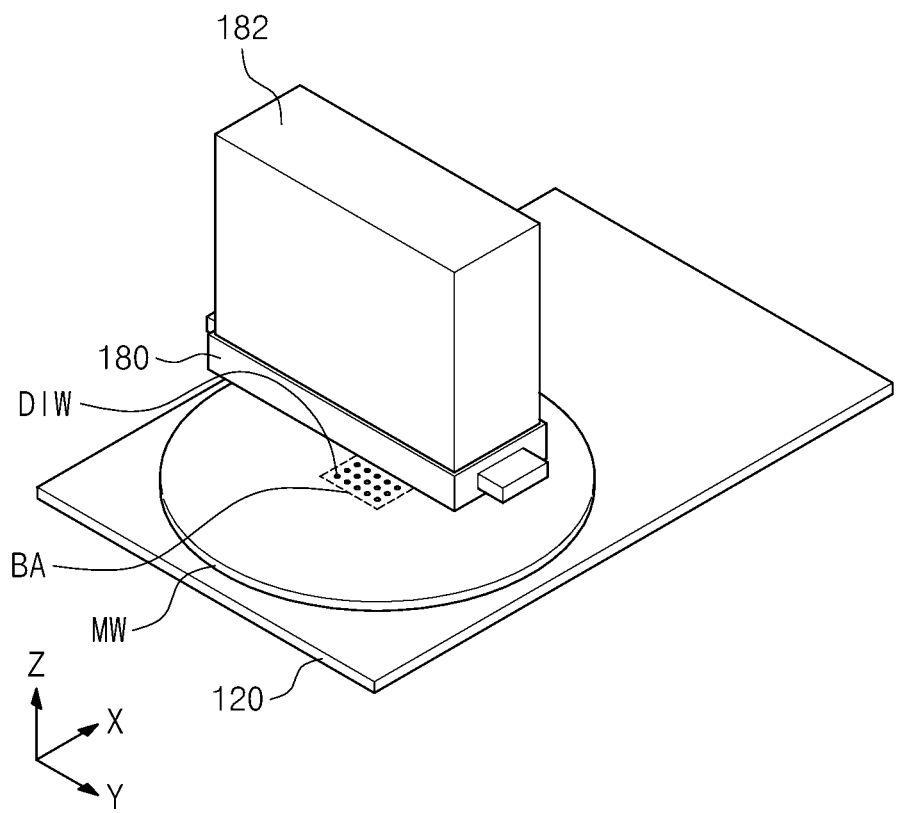
Figure 13:
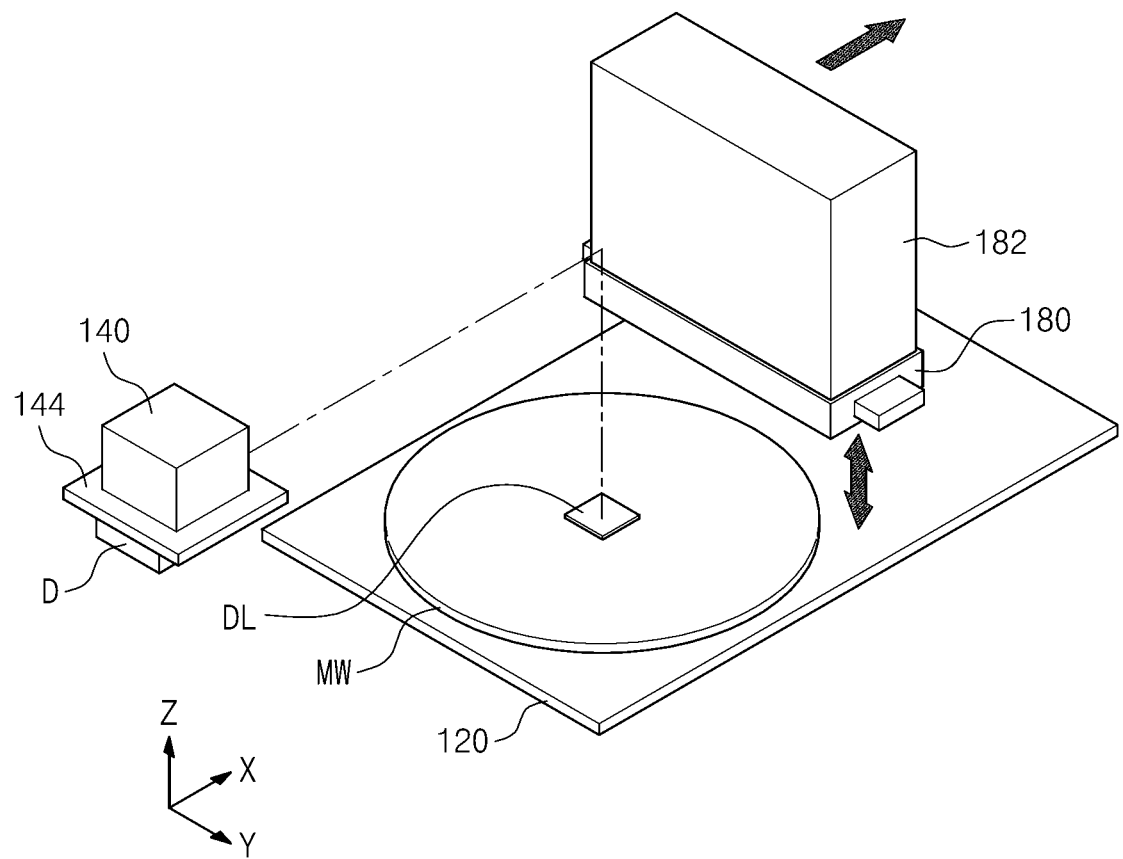

FIGS. 11 to 13 are views illustrating operation of the wetting device constituting the die bonding apparatus according to the embodiment of the inventive concept. FIG. 11 illustrates a state in which the wetting device 180 is located in a retreat area, and FIG. 12 illustrates a state in which the wetting device 180 is located over a bonding area BA on the substrate MW to perform a wetting process on the bonding area BA. Referring to FIGS. 5, 6, and 11 to 13, the wetting device 180 forms a liquid film (a water film) on the bonding area BA by supplying a liquid DIW, including water, to the bonding area BA on the substrate MW to which the die D is to be bonded. In an embodiment, the wetting device 180 may be implemented with a jetting-type patterning device that has a piezoelectric element applied thereto and that forms a liquid film on the bonding area BA by spraying DI water. While the die D is transferred from the support unit 110 to the bonding stage 120, the wetting device 180 may perform a wetting process of locally forming a liquid film on the bonding area BA of the substrate MW.

The wetting device 180 may be transferred between the area above the bonding stage 120 and the retreat area distant from the bonding stage 120 along the transfer rails 132. The wetting device 180 may be moved along the first direction X by a movement unit 182 that is coupled to the transfer rails 132 so as to be movable. The wetting device 180 may be raised or lowered in the third direction Z by a lifting unit 180a mounted in the movement unit 182.

After a liquid film DL is formed on the bonding area BA of the substrate MW by the wetting device 180, as illustrated in FIG. 13, the wetting device 180 moves to the retreat area after performing the wetting process on the bonding area BA of the substrate MW, and the bonding head 140 moves the die D onto the bonding area BA of the substrate MW. When the bonding head 140 releases the die D in the state in which the die D is brought into contact with the bonding area BA, the die D is stacked on the substrate MW and is pre-bonded to the substrate MW by the bonding force (the hydrogen bonding force) between the hydrophilized bonding surface of the die D and the liquid film DL.

Referring again to FIGS. 5 and 6, for alignment of the die D and substrate MW, an alignment examination unit 190 recognizes the locations of the die D and the substrate MW based on vision and determines the bonding area BA on the substrate MW. The alignment examination unit 190 may be provided so as to be movable in the first direction X along the transfer rails 132, or may be fixedly mounted on the frame 130. The DIW application location of the wetting device 180 and the alignment location of the die D and the substrate DW may be controlled based on the locations of the die D and the substrate MW. The bonding stage 120 may be provided so as to be movable along guide rails 122 arranged along the second direction Y. The location of the substrate MW is able to be adjusted in the left/right direction (the second direction Y) by the bonding stage 120.

Figure 14:
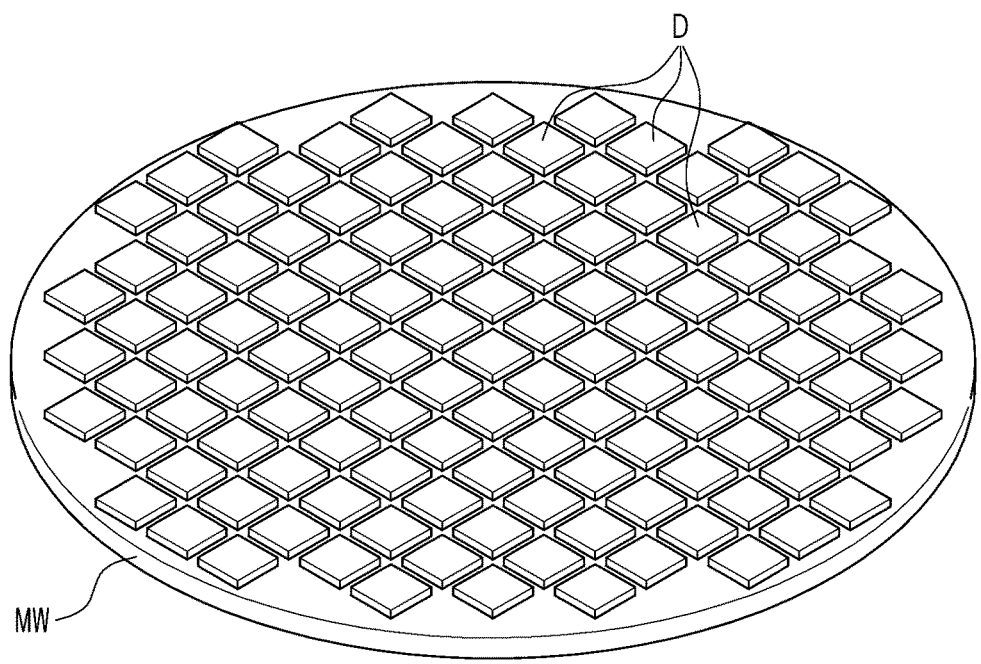
FIG. 14 is a view illustrating a substrate having a plurality of dies pre-bonded thereto according to an embodiment of the inventive concept.
Figure 15:
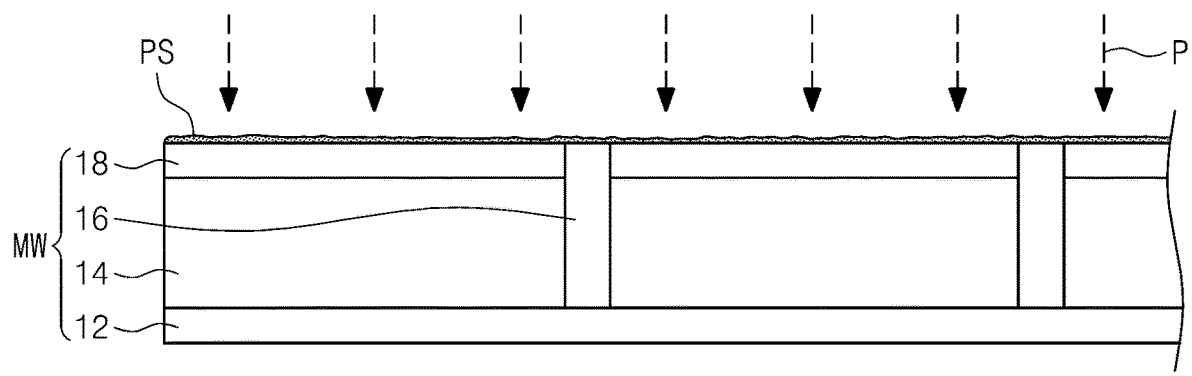
FIGS. 15 to 19 are schematic views illustrating a die bonding method according to an embodiment of the inventive concept.

FIG. 14 is a view illustrating a substrate having a plurality of dies pre-bonded thereto according to an embodiment of the inventive concept. After a plurality of dies D are pre-bonded to the substrate MW by sequentially and repeatedly performing the above-described processes on the plurality of dies D, the substrate MW having the plurality of dies D pre-bonded thereto is transferred into the heat treatment unit (not illustrated) by a transfer device (not illustrated). The heat treatment unit performs heat treatment on the substrate MW, which has the plurality of dies D pre-bonded thereto, in a high-pressure and high-temperature atmosphere to simultaneously post-bond the plurality of dies D to the substrate MW. In an embodiment, to post-bond the dies D by effectively curing bonding interfaces between the substrate MW and the dies D or between the dies D, the heat treatment unit may perform the heat treatment for about one hour under an atmosphere of an inert gas, such as a nitrogen gas, at a temperature of 300° C. to 350° C. and a pressure of 1.9 MPa to 2.5 MPa.

FIGS. 15 to 19 are schematic views illustrating a die bonding method according to an embodiment of the inventive concept. First, referring to FIG. 15, the upper surface of a substrate MW is changed into a hydrophilic surface PS1 by forming a plasma zone P on the upper surface of the substrate MW. The substrate MW having the hydrophilic surface PS1 by the plasma processing may be transferred to the bonding stage 120 by a transfer unit (not illustrated). In an embodiment, the substrate MW may be a TSV substrate that includes a silicon substrate 14, Through Silicon Vias (TSVs) 16 formed through the silicon substrate 14, and insulation films 12 and 18 formed on the upper surface and the lower surface of the silicon substrate 14 except for the TSVs 16.

Figure 16:
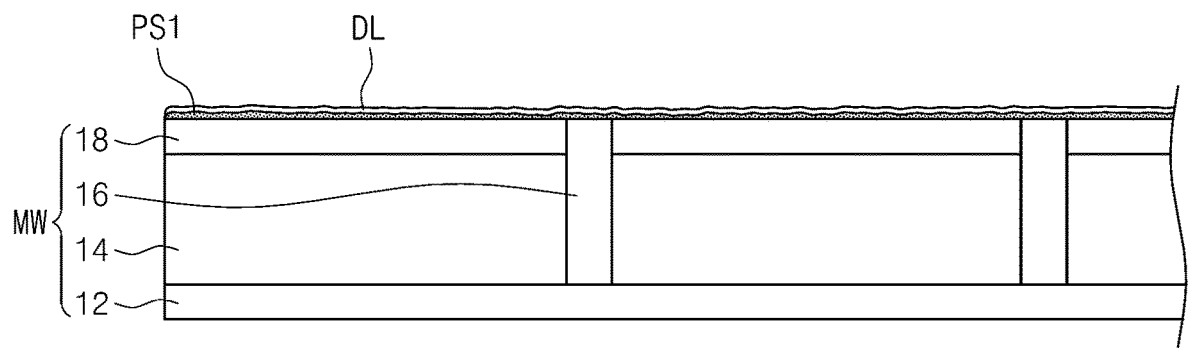
Figure 17:
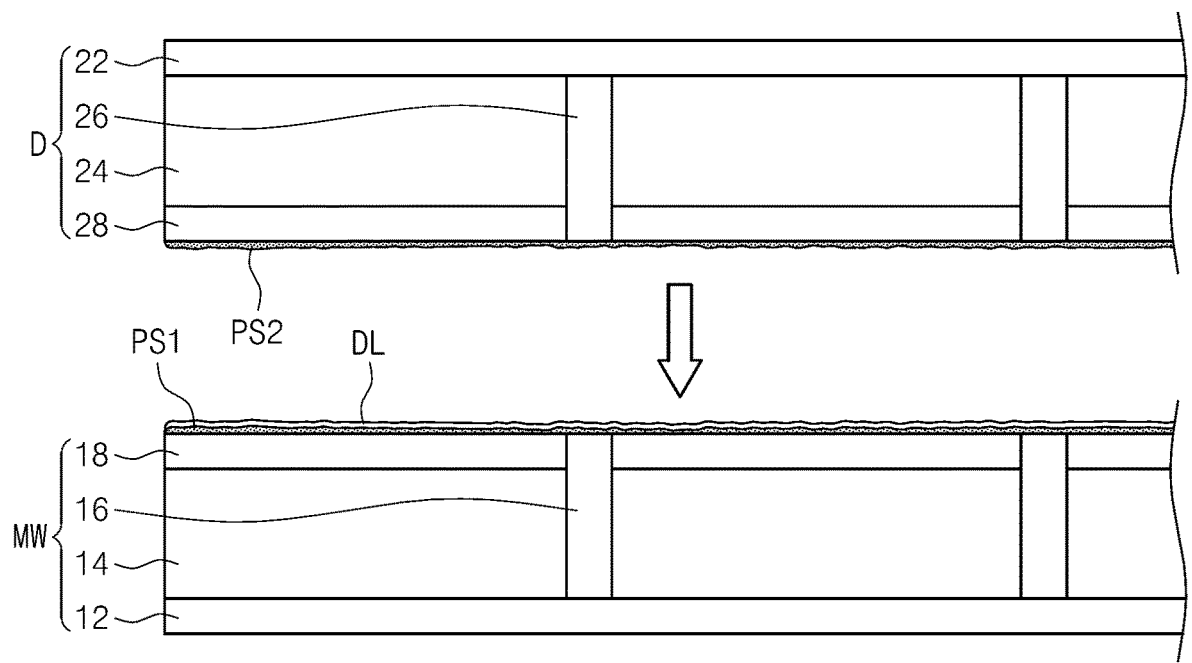
Figure 18:
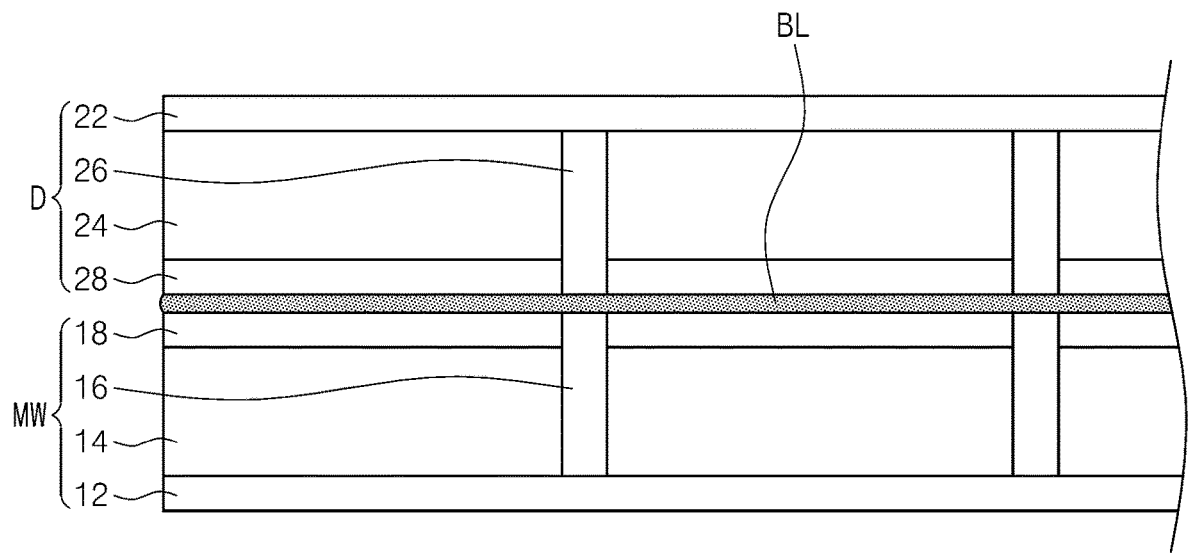

Referring to FIG. 16, a liquid film DL is formed by performing a wetting process of supplying a liquid such as DI water to a bonding area of the substrate MW that is hydrophilized by the plasma. Referring to FIG. 17, a die D, the lower surface of which is changed into a hydrophilic surface PS2 by the atmospheric plasma device 170, is stacked on the bonding area of the substrate MW. The die D may be a TSV die that includes a silicon substrate 24, Through Silicon Vias (TSVs) 26 formed through the silicon substrate 24, and insulation films 22 and 28 formed on the upper surface and the lower surface of the silicon substrate 24 except for the TSVs 26.

Figure 19:
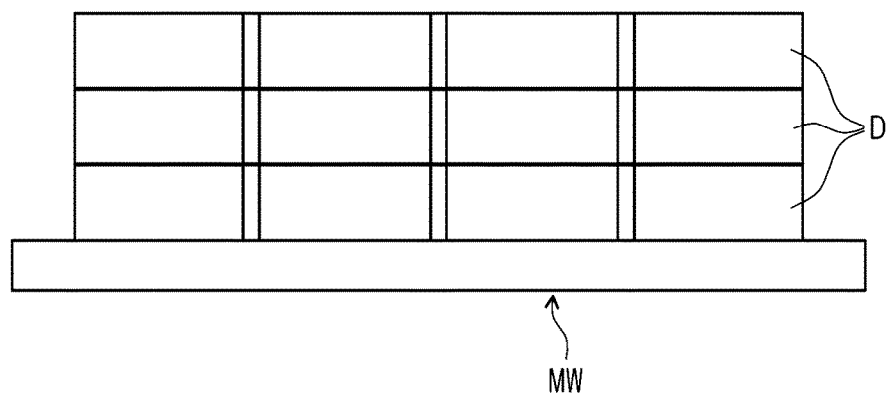

Referring to FIGS. 15 to 18, the hydrophilic surface PS1, the liquid film DL, and the hydrophilic surface PS2 formed at the interface between the substrate MW and the die D are heated and cured by performing heat treatment on the substrate MW in a high-temperature and high-pressure atmosphere after the pre-bonding of the die D to the substrate MW, and thus the die D is completely bonded to the substrate MW through a bonding interface BL. FIG. 19 is a view illustrating a state in which a plurality of dies are stacked on and bonded to a substrate according to an embodiment of the inventive concept. Referring to FIG. 19, a three-dimensional semiconductor may be manufactured by sequentially stacking and pre-bonding a plurality of dies D to a substrate MW and thereafter performing post-bonding on the substrate W and the plurality of dies D at a time.

According to the embodiment of the inventive concept, the die bonding method may bond TSV dies through an atmospheric plasma process and a DIW spray process without using a separate bonding medium such as an adhesion film or solder bumps. Accordingly, the die bonding method may solve the problems of a sweep by a solder bump, a short circuit due to a connection with a surrounding solder bump, and a defect in a current flow, thereby improving the quality of a semiconductor and enabling bonding of a TSV die irrespective of the scaling-down of an I/O pitch. Furthermore, the die bonding method may hydrophilize a bonding surface of a die by atmospheric plasma processing without stopping transferring the die and may simultaneously perform a wetting process of dropping DI water to a bonding area of a substrate while the die is being transferred, thereby rapidly performing a pre-bonding process on the die.

Figure 20:
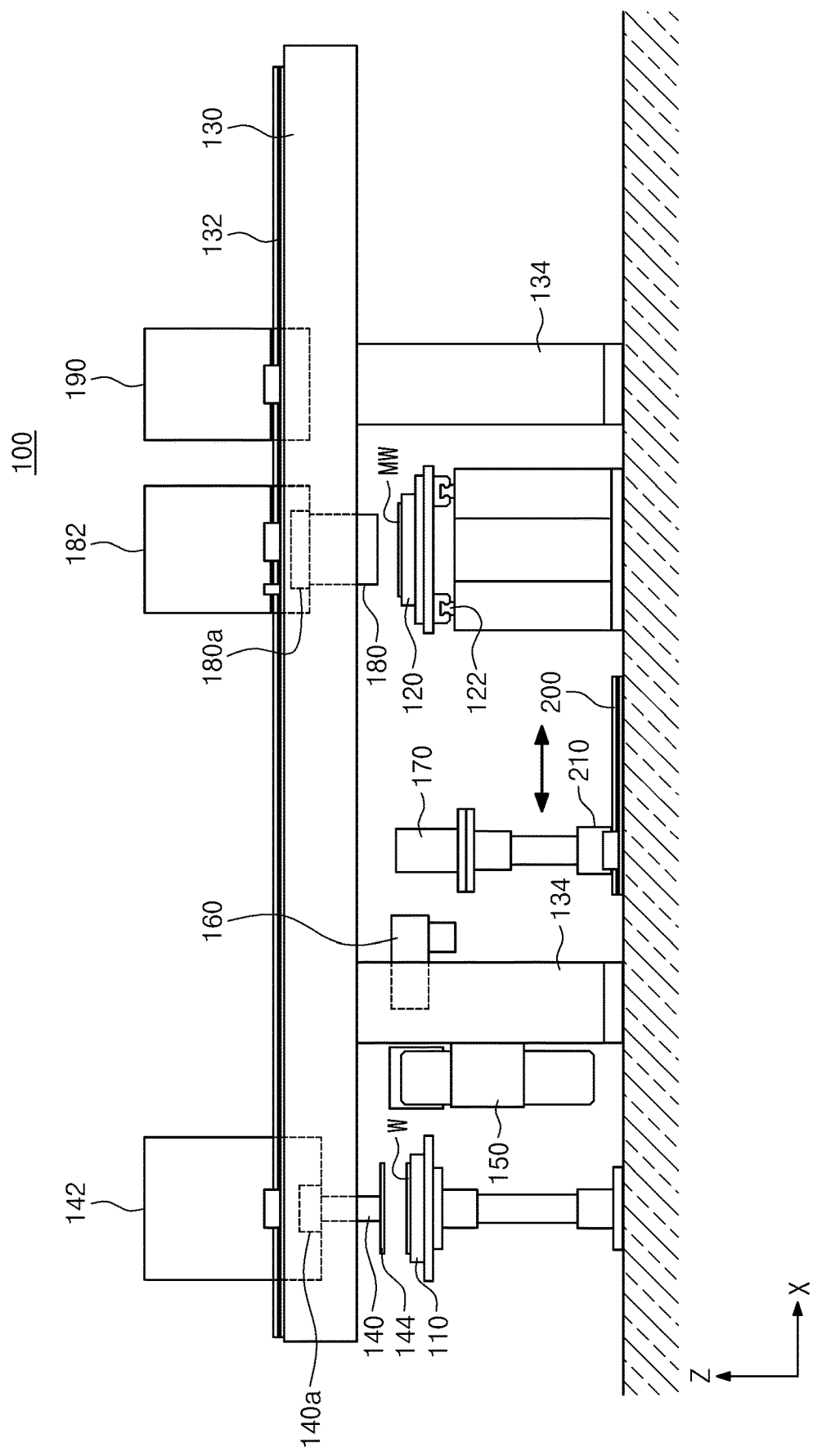
FIG. 20 is a schematic side view illustrating a die bonding apparatus according to another embodiment of the inventive concept.
Figure 21:
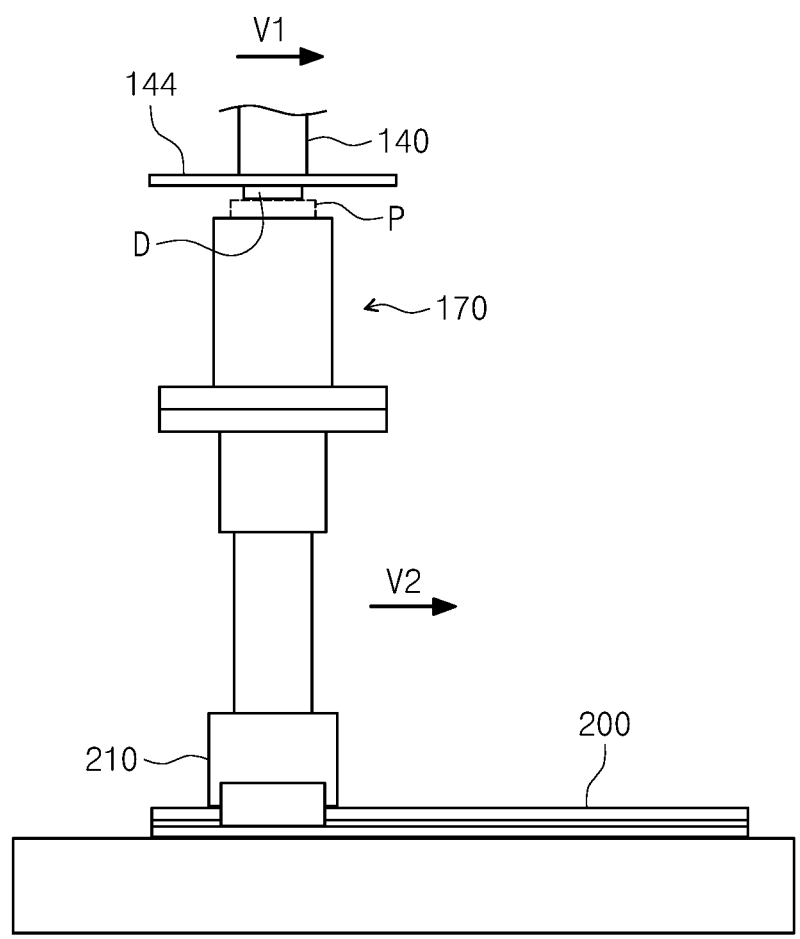
FIG. 21 is a view illustrating operation of the die bonding apparatus according to the embodiment of FIG. 20.

FIG. 20 is a schematic side view illustrating a die bonding apparatus according to another embodiment of the inventive concept. FIG. 21 is a view illustrating operation of the die bonding apparatus according to the embodiment of FIG. 20. Referring to FIGS. 20 and 21, the die bonding apparatus 100 may further include a transfer device 210 that moves the atmospheric plasma device 170 along a rail 200 arranged in the transfer direction of the die D (in the first direction X).

While the die D moves in the plasma processing interval, the transfer device 210 may move the atmospheric plasma device 170 at a speed equal to or lower than the transfer speed V1 of the die D (or the moving speed of the bonding head 140). When the moving speed V1 of the bonding head 140 is equal to the moving speed V2 of the atmospheric plasma device 170, the relative speed between the die D and the atmospheric plasma device 170 is equal to zero, and the same high hydrophilic effect as performing plasma processing on the die D in a stop state may be obtained even though the die D is moving toward the bonding stage 120.

When the atmospheric plasma device 170 is moved at a speed lower than the moving speed V1 of the die D, the same hydrophilic effect as passing the die D through the plasma zone P of the atmospheric plasma device 170 at a speed V1-V2 lower than the actual transfer speed V1 while rapidly transferring the die D may be obtained. Therefore, according to the embodiment of FIGS. 20 and 21, an effect of sufficiently hydrophilizing the bonding surface of the die D by the atmospheric plasma device 170 while transferring the die D at high speed may be obtained.

Various drive means such as a drive motor, a hydraulic cylinder, a pneumatic cylinder, and the like may be used as power sources for the bonding stage 120, the bonding head 140, the wetting device 180, the alignment examination unit 190, the transfer device 210, and the like. Furthermore, in the driving scheme, without being limited to those illustrated, various drive mechanisms such as a transfer belt, a rack/pinion gear, a screw gear, and the like may be used.

Although the die bonding apparatus for bonding a die to a substrate has been described, the die bonding apparatus may be used as a substrate bonding apparatus that bonds substrates together. In the substrate bonding apparatus that bonds the substrates together, the upper substrate may be transferred by the bonding head 140 from the support unit 110 to the area above the lower substrate supported on the bonding stage 120. The lower surface of the upper substrate may be hydrophilized by the atmospheric plasma device 170 of a flying type while the upper substrate is transferred from the support unit 110 to the bonding stage 120. The plasma zone formed by the atmospheric plasma device 170 preferably has a length in the second direction that is equal to or greater than the diameter of the upper substrate.

The apparatuses and the methods according to the embodiments of the inventive concept may bond a die to a substrate, or may bond substrates together, without using bonding mediums such as an adhesion film and a solder bump.

In addition, the apparatuses and the methods according to the embodiments of the inventive concept may effectively bond a die to a substrate or may effectively bond substrates together and may reduce process time taken to pre-bond and post-bond a die or a substrate.

Effects of the inventive concept are not limited to the above-described effects. Any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A die bonding apparatus for bonding a die to a substrate, the die bonding apparatus comprising:
    a chuck configured to support the die;
    a bonding stage configured to support the substrate;
    a ground plate with vacuum suction provided between the chuck and the bonding stage so as to be movable and configured to pick up the die and transfer the die to a bonding area on the substrate;
    an atmospheric plasma device configured to hydrophilize a bonding surface of the die that is to be bonded to the substrate, by plasma processing;
    a piezoelectric liquid jetting head configured to form a liquid film on the bonding area of the substrate that is to be bonded with the die, by supplying a liquid including water to the bonding area of the substrate; and
    a transfer device configured to move the atmospheric plasma device along a transfer direction of the die;
    wherein the atmospheric plasma device includes hydrophilic radicals,
    the hydrophilic radicals include hydrogen or hydroxyl radicals, and
    wherein the transfer device moves the atmospheric plasma device at a speed lower than a transfer speed of the die while the die is moved in a plasma processing interval.

2. The die bonding apparatus of claim 1, wherein the ground plate with vacuum suction pre-bonds the die to the substrate by a bonding force between the hydrophilized bonding surface of the die and the liquid film, by bringing the bonding surface of the die into contact with the liquid film.

3. The die bonding apparatus of claim 1, further comprising:
    a heating chamber configured to post-bond one or more dies to the substrate at the same time, by performing heat treatment in a state in which the one or more dies are pre-bonded to the substrate.

4. The die bonding apparatus of claim 1, wherein the atmospheric plasma device is provided between the chuck and the bonding stage.

5. The die bonding apparatus of claim 4, further comprising:
    any one of air, vacuum, and ionizer devices provided between the chuck and the atmospheric plasma device and configured to clean the bonding surface of the die picked up by the ground plate with vacuum suction.

6. The die bonding apparatus of claim 4, wherein the atmospheric plasma device forms a plasma zone containing hydrophilic radicals on a top of the atmospheric plasma device, and the plasma zone overlaps a transfer path of the die.

7. The die bonding apparatus of claim 6, further comprising:
    a detector configured to detect whether the die is located within the plasma processing interval of the atmospheric plasma device; and
    a controller configured to stop operation of the atmospheric plasma device when the die is not located within the plasma processing interval and configured to operate the atmospheric plasma device to generate plasma when the die is located within the plasma processing interval.

8. The die bonding apparatus of claim 1, wherein the piezoelectric liquid jetting head locally forms the liquid film on the bonding area of the substrate that is to be bonded with the die.

9. The die bonding apparatus of claim 1, further comprising:
    a transfer rail arranged along a transfer direction of the die,
    wherein the piezoelectric liquid jetting head is transferred between an area above the bonding stage and a retreat area distant from the bonding stage along the transfer rail.

10. A substrate bonding apparatus for bonding a second substrate to a first substrate, the substrate bonding apparatus comprising:
    a chuck configured to support the second substrate;
    a bonding stage configured to support the first substrate;
    a ground plate with vacuum suction-provided between the chuck and the bonding stage so as to be movable and configured to pick up the second substrate and transfer the second substrate above the first substrate;
    an atmospheric plasma device configured to hydrophilize a lower surface of the second substrate by plasma processing;
    a piezoelectric liquid jetting head configured to form a liquid film by supplying a liquid including water to an upper surface of the first substrate; and
    a transfer device configured to move the atmospheric plasma device along a transfer direction of the die;
    wherein the atmospheric plasma device includes hydrophilic radicals,
    the hydrophilic radicals include hydrogen or hydroxyl radicals, and
    wherein the transfer device moves the atmospheric plasma device at a speed lower than a transfer speed of the die while the die is moved in a plasma processing interval.

11. The substrate bonding apparatus of claim 10, wherein the ground plate with vacuum suction-pre-bonds the second substrate to the first substrate by a bonding force between the hydrophilized lower surface of the second substrate and the liquid film, by bringing the lower surface of the second substrate into contact with the liquid film.

12. The substrate bonding apparatus of claim 11, further comprising:
    a heating chamber configured to post-bond the second substrate to the first substrate by performing heat treatment in a state in which the second substrate is pre-bonded to the first substrate.

13. The substrate bonding apparatus of claim 12, wherein the atmospheric plasma device is provided between the chuck and the bonding stage.

14. The substrate bonding apparatus of claim 13, wherein the atmospheric plasma device forms a plasma zone containing hydrophilic radicals on a top of the atmospheric plasma device, and the plasma zone overlaps a transfer path of the second substrate.

15. The substrate bonding apparatus of claim 14, further comprising:
   a detector configured to detect whether the second substrate is located within a plasma processing interval of the atmospheric plasma device; and
   a controller configured to stop operation of the atmospheric plasma device when the second substrate is not located within the plasma processing interval and configured to operate the atmospheric plasma device to generate plasma when the second substrate is located within the plasma processing interval.

16. The substrate bonding apparatus of claim 15, further comprising:
   a transfer rail arranged along a transfer direction of the second substrate,
   wherein the piezoelectric liquid jetting head is transferred between an area above the bonding stage and a retreat area distant from the bonding stage along the transfer rail.

* * * * *